United States Patent
Burek et al.

(10) Patent No.: US 10,120,012 B2
(45) Date of Patent: Nov. 6, 2018

(54) METHOD AND APPARATUS FOR DETECTING FAULT IN A MIXED CONFIGURATION POWER TRANSMISSION LINE

(71) Applicant: ABB Schweiz AG, Baden (CH)

(72) Inventors: Arkadiusz Burek, Wieliczka (PL); Jianping Wang, Västerås (SE); Jiuping Pan, Raleigh, NC (US); Reynaldo Nuqui, Cary, NC (US); YouYi Li, Västerås (SE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/569,900

(22) PCT Filed: May 5, 2015

(86) PCT No.: PCT/EP2015/059837
§ 371 (c)(1),
(2) Date: Oct. 27, 2017

(87) PCT Pub. No.: WO2016/177407
PCT Pub. Date: Nov. 10, 2016

(65) Prior Publication Data
US 2018/0106849 A1    Apr. 19, 2018

(51) Int. Cl.
*G01R 31/08* (2006.01)
*G01R 31/11* (2006.01)
(Continued)

(52) U.S. Cl.
CPC ............ *G01R 31/085* (2013.01); *G01R 31/11* (2013.01); *H02H 3/06* (2013.01); *H02H 3/087* (2013.01);
(Continued)

(58) Field of Classification Search
CPC ........ G01R 31/985; G01R 41/11; H02H 3/06; H02H 3/087; H02H 3/202; H02H 7/265; H02H 7/268
See application file for complete search history.

(56) References Cited

U.S. PATENT DOCUMENTS 9,470,748 B2 * 10/2016 Schweitzer, III .. G01R 31/2836
9,588,168 B2 * 3/2017 Schweitzer, III .... G01R 31/088
(Continued)

FOREIGN PATENT DOCUMENTS

CN          101783505 A     7/2010
WO    WO 2011/127967 A1   10/2011

OTHER PUBLICATIONS

International Preliminary Report on Patentability, issued in PCT/EP2015/059837, dated Apr. 19, 2017.
(Continued)

*Primary Examiner* — Zee V Kitov
(74) *Attorney, Agent, or Firm* — Birch, Stewart, Kolasch & Birch, LLP (57) ABSTRACT

A method and an apparatus for fault detection in a mixed configuration power transmission line including a plurality of sections arranged between one end of the transmission line and the other end of the transmission line and including at least one overhead line section and at least one cable section are disclosed. Based on a comparison travelling wave voltage or current time derivatives at the one end and the other end of the power transmission line with selected threshold values, it is determined if there is a fault occurring in at least one cable section of the power transmission line. Embodiments utilize amplification of travelling wave voltages and/or currents which may occur at junctions between
(Continued)

a cable section and an adjacent overhead line section in determining if the fault occurs in a cable section of the power transmission line.

20 Claims, 3 Drawing Sheets

(51) Int. Cl.
    *H02H 3/06*     (2006.01)
    *H02H 7/26*     (2006.01)
    *H02H 3/087*     (2006.01)
    *H02H 3/20*     (2006.01)

(52) U.S. Cl.
    CPC ............ *H02H 3/202* (2013.01); *H02H 7/265* (2013.01); *H02H 7/268* (2013.01)

(56) References Cited

U.S. PATENT DOCUMENTS

2014/0300370 A1* 10/2014 Paolone ............... G01R 31/085
    324/522
2017/0133834 A1* 5/2017 Blug ...................... H02H 3/087
2017/0345598 A1* 11/2017 Yang ....................... H01H 71/04

OTHER PUBLICATIONS

International Search Report, issued in PCT/EP2015/059837, dated Feb. 5, 2016.
Naidoo et al., "HVDC Line Protection for the Proposed Future HVDC Systems", 2004 International Conference on Power System Technology—POWERCON 2004, Singapore, Nov. 21-24, 2004, XP-002753223, pp. 1327-1332.
Written Opinion of the International Searchning Authority, issued in PCT/EP2015/059837, dated Feb. 5, 2016.

* cited by examiner

METHOD AND APPARATUS FOR DETECTING FAULT IN A MIXED CONFIGURATION POWER TRANSMISSION LINE

TECHNICAL FIELD

The present invention generally relates to the field of power transmission systems, which for example may include a High Voltage Direct Current (HVDC) power system. Specifically, the present invention relates to a method of fault detection in a power transmission line which comprises a plurality of sections comprising at least one overhead line section and at least one cable section, and wherein on a condition that a fault occurs in the transmission line with travelling wave signals generated in the power transmission line.

BACKGROUND

A fault protection or detection unit may be employed for monitoring one or several transmission lines of a power transmission system, or network, or grid. In the event of a fault occurring in a transmission line, the fault protection unit may trip, or open, circuit breakers located at each end of the transmission line in order to disconnect the transmission line in which a fault occurs from the rest of the power transmission system. Thereby, the risk of propagation of the fault in the power transmission system may be mitigated or even eliminated. Subsequently, depending on the types of fault, the circuit breakers may be automatically closed in order to quickly restore power transmission via the transmission line that was previously disconnected from rest of the power transmission system. This may be referred to as auto-reclosing. Hence, once the temporary or transient fault has been cleared, or after some selected or predefined period of time based on arc extinction time, which for example may be set based on the estimated time required to quench arcs which may appear in the circuit breakers when they are opened to interrupt the current. Auto-reclosing may for example be initiated on a condition that a trip signal is transmitted to the circuit breaker(s).

Thus, in overhead transmission lines or overhead lines (OHLs) auto-reclosing protection may be utilized. In OHLs, most of the faults are temporary or transient faults, for example due to a lightning strike and/or flashover. Due to the temporary or transient nature of the faults, an auto-reclosing protection scheme may therefore be applied. On the other hand, in transmission lines which are based solely on cables, virtually all of the faults that may occur are permanent faults, which for example may be due to a short-circuit between conductors. In that case, auto-reclosing should not be applied. In some cases, permanent faults may occur also in OHLs. In the event of a permanent fault, the faulty line will typically have to be tripped (isolated) again by the protection equipment after unsuccessful auto-reclosing actions. Then, the line with permanent fault will be serviced by maintenance personnel.

In High Voltage Direct Current (HVDC) power systems, DC circuit breakers may be tripped following a DC fault in a HVDC transmission line, and after that the HVDC transmission line is often re-energized by reclosing the DC circuit breakers. If the fault is temporary, the HVDC converters will ramp up their power outputs back to the desired HVDC transmission line load. If the fault is permanent, the HVDC transmission line will be tripped again and then de-energized for maintenance. Consider as an example a multi-terminal voltage source converter (VSC) based HVDC power system. In such a power system, faults on a DC cable or a DC OHL are typically isolated from the rest of the power system by temporarily shutting down the DC line, or temporarily taking the DC line out of operation, using DC circuit breakers. For an OHL, the DC line may be put back into operation after a selected or predefined reclosing waiting time based on arc extinction time to allow for the insulation to be restored in case it is a temporary fault. However, if the fault is a permanent fault, the DC line will be shut down again after reclosing it. In that case, the DC line may have to be shut down for a relatively long period, in order to allow for maintenance personnel to locate and clear the fault. Events leading to DC line faults could happen mainly during normal operation when the DC line is energized. For faults in DC OHLs, DC circuit breakers are typically designed to auto-reclose after some selected or predefined time period, with the length of the time period being based on the arc extinction time that it takes for the insulation in the fault location to be restored. In case of temporary faults, the DC circuit breakers will first be tripped, and the DC line will then be restored back to normal operation following successful auto reclosing. In case of permanent faults however, the DC circuit breakers need to be tripped again after auto reclosing since there may still be a fault present in the DC line.

In HVDC grids, only the component(s) or element(s) of the power system in which there is a fault should preferably be isolated from the rest of the power system, so as to ensure continued operation of the HVDC grid and reduce or minimize downtime thereof. Isolation of the faulty component(s) or element(s) is usually achieved by way of operation of circuit breakers. Reclosing a circuit breaker relatively quickly following opening of a circuit breaker is often done in the interest of maintaining stability of the electric power system and quick power restoration. For example HVDC grids which are used for transmission, distribution, etc., of power generated based on renewable energy sources are expected to include transmission lines containing different types of transmission line portions or sections, e.g., so as to include cable and overhead line sections. Such transmission lines may in the following be referred to as mixed transmission lines, or mixed configuration transmission lines. One application where such transmission lines are expected to be increasingly utilized is in transmission or distribution of power generated at offshore wind power generating plants to onshore locations.

SUMMARY

Detection or identification of the location or section in a mixed HVDC transmission line in which a fault occurs often presents a challenge to operators of HVDC links. By determining the faulty section in a mixed HVDC transmission line, re-energizing of the HVDC transmission line in case the fault is permanent may be avoided. This may be particularly advantageous in HVDC grids with half bridge VSCs, since in that case the fault current may be relatively high at the DC line side. In principle all faults which may occur in cables are permanent faults and solid faults, while faults which may occur in overhead lines are either temporary or permanent faults. If a fault can be ascertained to be located in a cable section of the HVDC transmission line, then the fault may be considered to be a permanent fault. In that case, the HVDC transmission line should not be re-energized, since this may create further disturbance in the power system(s) connected to the HVDC transmission line, and may yet again expose HVDC converters to a fault current. In HVDC grids, avoiding re-energizing a mixed HVDC transmission line in case there is a cable fault in the mixed HVDC transmission line may reduce damage on the cable and possibly further disturbance in any power systems connected to the mixed HVDC power transmission line, and may also reduce or minimize wear on switching equipment such as circuit breakers and/or HVDC converter valves.

In view of the above, a concern of the present invention is to provide means for determining whether a fault which may occur in a mixed power transmission line is in a cable section of the power transmission line.

To address at least one of this concern and other concerns, a method and an apparatus in accordance with the independent claims are provided. Preferred embodiments are defined by the dependent claims.

In the event of a fault occurring in the transmission line, transients that propagate along the transmission line as waves may be created. That is to say, a fault which may occur in the transmission line may cause travelling waves that propagate through the transmission line away from the fault location. The travelling waves may propagate through the transmission line at velocities close to the speed of light (the travelling wave speed in OHL is close to the speed of light and travelling wave speed in cable is about ⅔ of the light speed). Each wave may be a composite of frequencies, ranging from a few kHz to several MHz, having a fast rising front and a slower decaying tail. Composite waves may travel at a fraction or close to the speed of light in vacuum away from the fault location toward transmission line ends. For example in DC cables, waves may travel at speeds of about one third of the speed of light in vacuum. The waves may continue to travel throughout the power system until an equilibrium state is reached.

The surge impedance $Z_s$ of the power transmission line may be expressed as $Z_s=(L/C)^{1/2}$, where L is the power transmission line inductance per unit length of the power transmission line, and C is the power transmission line capacitance per unit length of the power transmission line. The velocity of a travelling wave in the power transmission line can be expressed as $(LC)^{-1/2}$. At the instant when the fault occurs, the travelling wave current $I_{TW}$ and the travelling wave voltage $V_{TW}$ are related by $V_{TW}=Z_s I_{TW}$.

The travelling waves undergo change at points in the transmission line where the surge impedance of the transmission line changes, e.g. at junctions between sections of different type of transmission line, or at a bus. At those points or junctions, the travelling waves can be entirely reflected, or they can be partially reflected and partially refracted, with the refracted portion of the travelling wave continuing to travel in the same direction as the travelling wave was travelling when reaching the point or junction in the transmission lines where the surge impedance of the transmission line changed. If the surge impedance of the transmission line after the point in the transmission line where the surge impedance of the transmission line changes, e.g., after a junction between sections of different type of transmission line, or at a bus, is $Z_b$, and the amplitude of the incident travelling wave is $a_i$, the amplitude of the reflected portion of the travelling wave is $a_{reflect}=[(Z_b-Z_s)/(Z_b+Z_s)]a_i$. The amplitude of the refracted portion of the travelling wave is $a_{refract}=1+a_{reflect}=[(2Z_b)/(Z_b+Z_s)]a_i$.

According to a first aspect there is provided a method of fault detection in a power transmission line comprising a plurality of sections arranged between one end of the transmission line and the other end of the transmission line, or, more generally, between a first end of the transmission line and a second end of the transmission line. The plurality of sections of the power transmission line comprises at least one overhead line section and at least one cable section. On a condition that a fault occurs in the power transmission line, at least one travelling wave is generated in the power transmission line. That is to say, if a fault occurs in the power transmission line, fault induced travelling waves may be generated in the power transmission line. The method comprises determining at least one first travelling wave voltage or current time derivative at the one end of the power transmission line, and determining at least one second travelling wave voltage or current time derivative at the other end of the power transmission line.

According to the method according to the first aspect it is determined that there is a fault occurring in at least one cable section of the power transmission line on a condition that:

a magnitude of the at least one first travelling wave voltage or current time derivative and/or a magnitude of the at least one second travelling wave voltage or current time derivative exceeds a first threshold value or a second threshold value, respectively, or:

the magnitude of the at least one first travelling wave voltage or current time derivative and the magnitude of the at least one second travelling wave voltage or current time derivative exceed a third threshold value and a fourth threshold value, respectively.

Each of the first threshold value and the second threshold value is based on the nominal transmission line voltage or current and an estimated refraction factor of the transmission line indicating the extent of refraction of the at least one travelling wave at a junction between the at least one cable section and an overhead line section adjacent to the at least one cable section.

Each of the third threshold value and the fourth threshold value is based on the nominal transmission line voltage or current, the estimated refraction factor, and an estimated attenuation of the at least one travelling wave when travelling through the at least one cable section towards the one end of the power transmission line and towards the other end of the power transmission line, respectively.

The first threshold value and the second threshold value may be (substantially) equal, or they may differ, e.g. depending on the lengths of mixed transmission line sections.

The third threshold value and the fourth threshold value may be (substantially) equal, or they may differ. The first threshold value may differ from the third threshold value and the fourth threshold value. The second threshold value may differ from the third threshold value and the fourth threshold value.

Consider as an example a power transmission line comprising three sections arranged between one (or a first) end of the power transmission line and the other (or a second) end of the power transmission line. The three sections include two overhead line sections arranged at the ends of the power transmission line and a cable section arranged between the two overhead line sections. On a condition that a fault occurs in the transmission line, at least one travelling wave is generated in the power transmission line. In case a fault occurs in the cable section, it will (in principle) always be a permanent, solid fault. The fault in the cable section induces a travelling wave voltage $V_{TW}$ which travels from the location of the fault in both directions along the power transmission line, in a forward direction $V_{TW,+}$, and in a backward direction $V_{TW,-}$. Assuming that the two overhead line sections each has a surge impedance $Z_{oh}$ and the cable section has a surge impedance $Z_c$, the travelling wave voltages $V_{TW,+}$ and $V_{TW,-}$ will be refracted into the overhead line sections with a refraction factor $k=[(2 \cdot Z_{oh})/(Z_{oh}+Z_c)]$. The refraction of the travelling wave voltages results in amplification of the travelling wave voltage. For example, assuming $Z_{oh}=350\Omega$ and $Z_c=20\Omega$ (the particular numerical values are exemplifying and are not to be considered as limiting), the refraction factor at the junctions between the cable section and the overhead line section will be about 1.9. The fault in the cable section also induces a travelling wave current $I_{TW}$. The same principles apply for the travelling wave current $I_{TW}$ as for the travelling wave voltage $V_{TW}$. Embodiments of the present invention utilize such amplification of travelling wave voltages (and/or currents) which may occur at junctions between a cable section and an adjacent overhead line section in identifying or determining if the fault occurs in a cable section of the power transmission line.

With further reference to the above-mentioned example of a power transmission line which comprises three sections arranged between one end of the power transmission line and the other end of the power transmission line, a fault in the cable section which is located relatively close to one of the junctions between the cable section and the overhead line sections may be determined based on voltage time derivatives of the travelling wave refracted into the overhead line section(s) as determined in the overhead line section(s) sides or ends, e.g., at stations arranged at the ends of the power transmission line. The fault in the cable section will generate a travelling wave voltage equal to, or approximately equal to, the nominal power transmission line voltage multiplied by the refraction factor k. Relatively close to the junction between the cable section and the overhead line section which is adjacent to the cable section in which the fault occurs, the travelling wave voltage will in general still not have experienced any significant attenuation, and the travelling wave will in general arrive at the end of the power transmission line in which the overhead line section is included still having a relatively large amplitude. Therefore, a fault in the cable section which is located relatively close to one of the junctions between the cable section and the overhead line sections may be determined by comparing a magnitude or absolute value of a travelling wave voltage or current time derivative at the end of the power transmission line in which the overhead line section that is adjacent to the cable section in which the fault occurs is included to a threshold, which is based on the nominal transmission line voltage or current and the refraction factor k. In case a fault would occur in the cable section relatively close to the other junction, the fault may be determined by measuring or determining a magnitude or absolute value of a travelling wave voltage or current time derivative at the other end of the power transmission line. In the latter case, the magnitude or absolute value of a travelling wave voltage or current time derivative may be compared to another threshold, which may or may not be the same as in the former case. The thresholds may be determined on a case-by-case basis, e.g., depending on the particular configuration of power transmission line, using for example power systems simulations by way of PSCAD®. PSCAD®, which is also known as PSCAD®/EMTDC™, is developed by Manitoba HVDC Research Centre, 211 Commerce Drive, Winnipeg, Manitoba, R3P 1A3, Canada.

With further reference to the above-mentioned example of a power transmission line which comprises three sections arranged between the ends of a mixed transmission line, a fault in the cable section located elsewhere, i.e. a fault which cannot be considered to be located relatively close to one of the junctions between the cable section and the overhead line sections as in the two cases described in the foregoing, may also be identified based on voltage time derivative of the travelling wave refracted into the overhead line section (s) as determined in the overhead line section(s) sides or ends, e.g., at stations arranged at the ends of the power transmission line. However, in this case, the magnitude or absolute value of a travelling wave voltage or current time derivative at the ends of the power transmission line should in general be compared to other thresholds than those used in case the fault in the cable section is located relatively close to one of the junctions between the cable section and the overhead line sections. For example, two threshold values may be defined or selected such that if the travelling wave voltage or current time derivative at one of the ends of the power transmission line exceeds one of the threshold values and if the travelling wave voltage or current time derivative at the other end of the power transmission line exceeds the other one of the threshold values, this means that the fault is not in one of the overhead line sections, and therefore that it must be in the cable section. To that end, the threshold values can for example be based on the nominal transmission line voltage or current, the estimated refraction factor, and an estimated attenuation of the at least one travelling wave when travelling through the cable section towards the one end of the power transmission line and towards the other end of the power transmission line, respectively. Based on the estimated attenuation of the at least one travelling wave when travelling through the cable section towards one end of the power transmission line and towards the other end of the power transmission line, respectively, a minimum travelling wave voltage or current time derivative at one end and the other end of the power transmission line, respectively, can be determined or estimated for the case where there is a fault in the cable section. The two threshold values may then be selected based on the estimated or determined minimum travelling wave voltage or current time derivatives at both ends of the power transmission line. Thereby, in case the travelling wave voltage or current time derivatives at the two ends of the power transmission line, respectively, exceed the respective ones of the two thresholds values, it may be determined that the fault is not on the overhead line section, and that it therefore must be in the cable section. Attenuation and distortion of waves due to their propagation along a current path in the transmission line generally result in a decrease in amplitude and elongation of the waves. The attenuation is generally due to loss of energy, e.g. in the resistances of the transmission line conductors and leakage capacitance to the earth. The distortion is generally due to the wave impedance being frequency dependent. An estimation of the attenuation of the at least one travelling wave when travelling through the cable section towards the one end of the power transmission line and towards the other end of the power transmission line, respectively, and thus the two threshold values, may be determined on a case-by-case basis, e.g., depending on the particular configuration of power transmission line, using for example power systems simulations by way of PSCAD®.

Thus, a method according to the first aspect may utilize any modification (in general amplification) of travelling wave voltages (and/or currents) that may occur at junctions between a cable section and an adjacent overhead line section for travelling waves which are travelling in a cable section and which are refracted into an adjacent overhead line section. The modification of travelling wave voltages (and/or currents) is used in order to identify or determine if the fault occurs in a cable section of the power transmission line, and can be carried out according to the same or similar principles as described in the foregoing for the example where the power transmission line comprises three sections arranged between two ends of the mixed power transmission line. A method according to the first aspect may be relatively easy to implement in a mixed configuration power transmission line, since it requires in principle only means for determining or receiving at least one first travelling wave voltage or current time derivative at one end of the power transmission line, and at least one second travelling wave voltage or current time derivative at the other end of the power transmission line. For example, travelling wave voltage time derivatives at both ends of the mixed power transmission line can be determined based on a number of sensor samplings of line voltage at the respective end, using for example a shunt resistor, so as to obtain a series of line voltages at different instants, and estimating the travelling wave voltage time derivatives at both ends of the power transmission line based on the change in line voltage over time e.g., during the line voltage sampling interval.

In the context of the present application, by a magnitude of a travelling wave voltage or current time derivative, it is meant the absolute value of the travelling wave voltage or current time derivative, and the two terms magnitude and absolute value are used interchangeably herein.

As indicated in the foregoing, the extent of refraction (or refraction factor) of the at least one travelling wave at a junction between the at least one cable section and an overhead line section adjacent to the at least one cable can for example be described or characterized based on or by way of the respective surge impedances, or surge admittances (the surge admittance being the reciprocal of the surge impedance), of the at least one cable section and the overhead line section adjacent to the at least one cable. The surge impedance or surge admittance may for example be determined or estimated by means of time-domain simulation techniques that provide a relatively accurate representation of the frequency dependent surge impedance. Such time-domain simulation techniques may for example be based on or be constituted by PSCAD®.

Each of the plurality of sections of the mixed power transmission line may comprise an overhead line section or a cable section.

The mixed power transmission line may for example comprise a plurality of overhead line sections and/or a plurality of cable sections. The one end of the mixed power transmission line may be included in a first overhead line section and the other end of the mixed power transmission line may be included in a second overhead line section. Thus, the at least one cable section may be arranged between the first overhead line section and may be connecting the first overhead line section with the second overhead line section.

According to one example, the mixed power transmission line may comprise at least two overhead line sections, and at least one cable section which is arranged between the at least two overhead line sections.

In response to determining that there is a fault occurring in the at least one cable section of the power transmission line, at least one protective action for the power transmission line may be performed.

The power transmission line may be selectively electrically connectable and disconnectable to a power system at the one end of the power transmission line and at the other end of the power transmission line, respectively, by way of at least one circuit breaker arranged at the one end of the power transmission line and at the other end of the power transmission line, respectively. The at least one protective action may for example comprise disabling auto-reclosing for the at least one circuit breaker at the one end of the power transmission line and at the other end of the power transmission line, respectively.

The power transmission line unit may for example comprise a DC power transmission line, such as a HVDC power transmission line, or several DC or HVDC power transmission lines for example arranged in a grid. A HVDC power transmission line may be arranged in configurations such as bi-pole, symmetric monopole, or monopole configurations. For example, a bipolar HVDC power transmission line comprises a positive pole line, a negative pole line, and a metallic return line connected to ground. Faults that may occur on a bipolar HVDC power transmission line include positive pole to negative pole short circuits, positive pole to ground short circuits, and negative pole to ground short circuits. Embodiments of the present invention may for example be implemented in the positive pole line and/or the negative pole line of a bipolar HVDC power transmission line, or in other mixed power transmission line configurations that can be envisaged by a person skilled in the art. In other words, the power transmission line may be included in the positive pole line and/or the negative pole line of a bipolar HVDC transmission line, or in another transmission line configuration.

According to an embodiment of the present invention, the power transmission line may be arranged in a bipolar configuration. The at least one first travelling wave voltage or current time derivative at the one end of the power transmission line may comprise at least one differential mode voltage or current time derivative at the one end of the power transmission line. The at least one second travelling wave voltage or current time derivative at the other end of the power transmission line may comprise at least one differential mode voltage or current time derivative at the other end of the power transmission line.

According to another embodiment of the present invention, the power transmission line is arranged in a monopolar configuration. The at least one first travelling wave voltage or current time derivative at the one end of the power transmission line may comprise at least one line terminal side voltage or current time derivative at the one end of the power transmission line. The at least one second travelling wave voltage or current time derivative at the other end of the power transmission line may comprise at least one line terminal side voltage or current time derivative at the other end of the power transmission line.

The determining of at least one first travelling wave voltage or current time derivative at one end of the power transmission line may for example comprise sensing at one end of the power transmission line a plurality of travelling wave voltages or currents at different points in time. The determining of at least one second travelling wave voltage or current time derivative at the other end of the power transmission line may for example comprise sensing at the other end of the power transmission line a plurality of travelling wave voltages or currents at different points in time. According to one or more embodiments of the present invention, the sensing at the one end of the power transmission line of the plurality of travelling wave voltages or currents and the sensing at the other end of the power transmission line of the plurality of second travelling wave voltages or current may for example be carried out during substantially the same period of time.

The same period of time may for example be a sampling or sensing time interval, e.g. between about 50 μs to 200 μs, for example about 100 μs, during which time interval the sensing at the one end of the power transmission line of the plurality of travelling wave voltages or currents and the sensing at the other end of the power transmission line of the plurality of travelling wave voltages or current may be carried out.

By "substantially" the same period of time, it is meant that for the sensing at the one end of the power transmission line of the plurality of travelling wave voltages or currents and the sensing at the other end of the power transmission line of the plurality of travelling wave voltages or current, the sensings may not necessarily be carried out at exactly the same time. This is due to that fault induced travelling waves might arrive at the ends of the mixed power transmission line at different time instants.

For sensing (travelling wave) voltages and/or currents at selected positions in the power transmission line any voltage and/or current sensing means known in the art may be used. For example, for sensing (travelling wave) voltages at a selected position in the power transmission line, at least one shunt resistor may be employed.

The travelling wave voltage at the ends of the power transmission line may for example be a travelling wave voltage between a pole conductor in the power transmission line and ground.

In determining of at least one travelling wave voltage or current time derivative at the one end of the power transmission line and/or determining of at least one travelling wave voltage or current time derivative at the other end of the power transmission line, a filter, for example a low pass filter such as a Butterworth filter, may be employed to facilitate capturing high frequency transient signals of the travelling waves. According to an example, the filter may be a second order low pass filter with a cut-off frequency of about 40 kHz According to embodiments of the present invention, the power transmission line system is part of a DC based power system, or possibly a power system based on DC components or constituents. Principles of embodiments of the present invention are applicable in a DC based power system and are based on equations for travelling wave voltage and/or current in a power transmission line.

According to a second aspect there is provided an apparatus, for example including or being constituted by at least one processing unit or processing module, for detecting fault in a power transmission line comprising a plurality of sections arranged between one end of the transmission line and the other end of the transmission line, wherein the plurality of sections of the power transmission line comprises at least one overhead line section and at least one cable section. On a condition that a fault occurs in the power transmission line, at least one travelling wave is generated in the power transmission line. The apparatus is configured to determine at least one first travelling wave voltage or current time derivative, for example based on a plurality of travelling wave voltages or currents sensed at different points in time at the one end of the power transmission line. The apparatus is configured to determine at least one second travelling wave voltage or current time derivative, for example based on a plurality of sensed travelling wave voltages or currents sensed at different points in time at the other end of the power transmission line. The apparatus is configured to determine that there is a fault occurring in at least one cable section of the power transmission line on a condition that:

a magnitude of the at least one first travelling wave voltage or current time derivative and/or a magnitude of the at least one second travelling wave voltage or current time derivative exceeds a first threshold value or a second threshold value, respectively, or the magnitude of the at least one first travelling wave voltage or current time derivative and the magnitude of the at least one second travelling wave voltage or current time derivative exceed a third threshold value and a fourth threshold value, respectively.

Each of the first threshold value and the second threshold value is based on the nominal transmission line voltage or current and an estimated refraction factor of the transmission line indicating the extent of refraction of the at least one travelling wave at a junction between the at least one cable section and an overhead line section adjacent to the at least one cable section.

Each of the third threshold value and the fourth threshold value is based on the nominal transmission line voltage or current, the estimated refraction factor, and an estimated attenuation of the at least one travelling wave when travelling through the at least one cable section towards the one end of the power transmission line and towards the other end of the power transmission line, respectively.

The apparatus may include or be constituted by any suitable central processing unit (CPU), microcontroller, digital signal processor (DSP), Application Specific Integrated Circuit (ASIC), Field Programmable Gate Array (FPGA), etc., or any combination thereof. The apparatus may optionally be capable of executing software instructions stored in a computer program product e.g. in the form of a memory. The memory may for example be any combination of read and write memory (RAM) and read only memory (ROM). The memory may comprise persistent storage, which for example can be a magnetic memory, an optical memory, a solid state memory or a remotely mounted memory, or any combination thereof.

According to a third aspect, there is provided a fault detection system for detecting fault in a power transmission line comprising a plurality of sections arranged between one end of the transmission line and the other end of the transmission line, wherein the plurality of sections of the power transmission line comprises at least one overhead line section and at least one cable section, and wherein on a condition that a fault occurs in the power transmission line at least one travelling wave is generated in the power transmission line. The fault detection system comprises at least one voltage and/or current sensing unit configured to sense, or measure, a plurality of travelling wave voltages or currents sensed at different points in time at the one end of the power transmission line, and sense a plurality of travelling wave voltages or currents sensed at different points in time at the other end of the power transmission line. The fault detection system comprises an apparatus according to the second aspect, configured to detect whether there is a fault in the power transmission line based on the sensed, or measured, travelling wave voltages or currents.

According to a fourth aspect, there is provided a power system, which comprises at least one transmission line, which interconnects at least two different portions of the power system, and a fault detection system according to the third aspect for detecting a fault or faults in the power transmission line.

According to a fifth aspect, there is provided a computer program product configured to, when executed in an apparatus according to the second aspect, perform a method according to the first aspect.

According to a sixth aspect, there is provided a computer-readable storage medium on which there is stored a computer program product configured to, when executed in an apparatus according to the second aspect, perform a method according to the first aspect.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the present invention will be described below with reference to the accompanying drawings.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments are provided by way of example so that this disclosure will convey the scope of the present invention to those skilled in the art.

Figure 1:
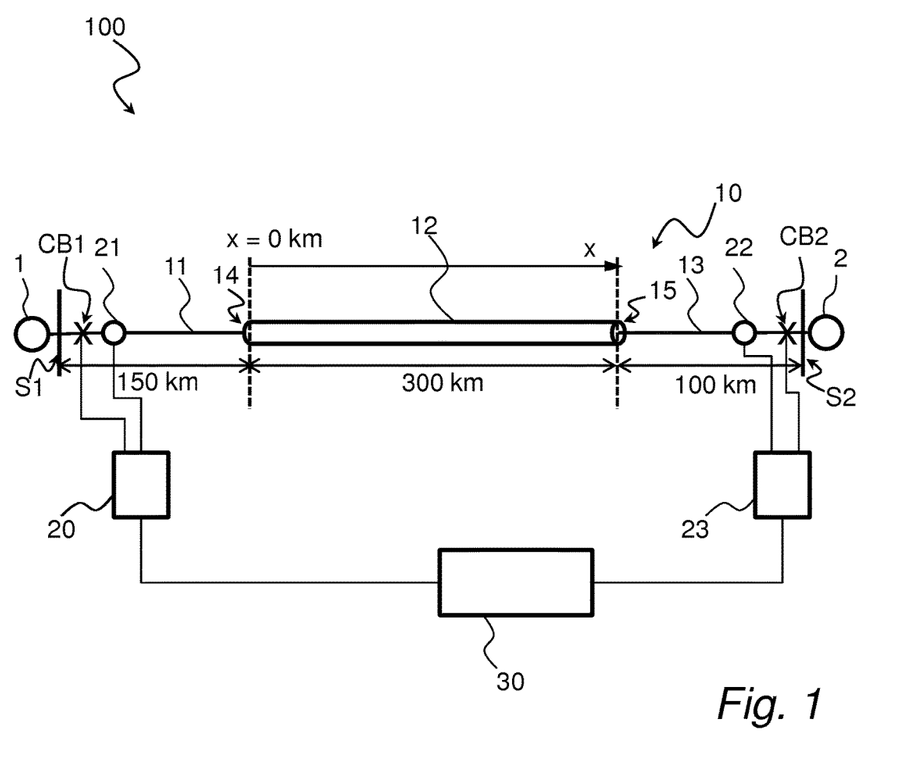
FIG. 1 is a schematic block diagram of a power system according to an embodiment of the present invention, the power system including a mixed power transmission line and an apparatus according to an embodiment of the present invention.

FIG. 1 is a schematic block diagram of a portion of a power system 100 according to an embodiment of the present invention. The power system 100 includes a power transmission line 10, which interconnects two different portions 1, 2 of the power system 100, and an apparatus 20, 23 according to an embodiment of the present invention. According to the embodiment of the present invention illustrated in FIG. 1, the apparatus 20, 23 comprises two processing and protection modules 20 and 23.

The power transmission line 10 is a mixed power transmission line which in general comprises a plurality of sections, with the plurality of sections of the power transmission line 10 comprising at least one overhead line section and at least one cable section. The power transmission line 10 has two ends (a left side end and a right side end), which in accordance with the embodiment illustrated in FIG. 1 are at, or constituted by or connected with, stations S1 and S2, respectively. The station S1 is connected with the portion 1 of the power system 100, and the station S2 is connected with the portion of the power system 100.

In accordance with the embodiment illustrated in FIG. 1, each of the plurality of sections of the power transmission line 10 may comprise an overhead line section or a cable section. The power transmission line 10 illustrated in FIG. 1 comprises three sections 11, 12, 13. The sections 11 and 13 of the power transmission line 10 are overhead line sections, and the section 12 of the power transmission line 10 is a cable section.

Further in accordance with the embodiment illustrated in FIG. 1, the one end at or connected with S1 of the power transmission line 10 is included in the overhead line section 11, and the other end at or connected with S2 of the power transmission line 10 is included in the overhead line section 13. Thereby, the cable section 12 is arranged between the overhead line section 11 and the second overhead line section 13.

As indicated in FIG. 1, the power transmission line 10 comprises a junction 14 between the overhead line section 11 and the cable section 12, and a junction 15 between the overhead line section 13 and the cable section 12.

On a condition that a fault occurs in the power transmission line 10, at least one travelling wave is generated in the power transmission line 10.

The apparatus 20, 23 may be configured to sense fault in the power transmission line 10. The processing and protection module 20 may be configured to determine at least one first travelling wave voltage or current time derivative at the one end at or connected with S1 of the power transmission line 10. For example, the processing and protection module 20 may be configured to determine the at least one first travelling wave voltage or current time derivative based on a plurality of travelling wave voltages or currents sensed at different points in time at the one end at or connected with S1 of the power transmission line 10. The processing and protection module 23 may be configured to determine at least one second travelling wave voltage or current time derivative at the other end at or connected with S2 of the power transmission line 10. For example, the processing and protection module 23 may be configured to determine the at least one second travelling wave voltage or current time derivative based on a plurality of travelling wave voltages or currents sensed at different points in time at the other end at or connected with S2 of the power transmission line 10.

The plurality of travelling wave voltages or currents sensed at the one end at S1 and at the other end at S2, respectively, may for example be received or retrieved by the processing and protection modules 20, 23, respectively, from respective voltage and/or current sensing units schematically indicated by the elements 21, 22 in FIG. 1. The voltage and/or current sensing unit 21 may be configured to sense a plurality of travelling wave voltages or currents at different points in time at one end S1 of the power transmission line 10, and the voltage and/or current sensing unit 22 may be configured to sense a plurality of travelling wave voltages or currents sensed at different points in time at the other end S2 of the power transmission line 10.

The travelling wave voltage at the ends S1, S2 of the power transmission line 10 may for example be a travelling wave voltage between a pole conductor in the power transmission line 10 and ground.

One or more of the voltage and/or current sensing units 21, 22 may for example comprise a current sensor connected in series with the transmission line, and a voltage sensor connected as a shunt connection, e.g., with one side connected to the transmission line (pole conductor) and the other side connected to a grounding point. The current sensor and the voltage sensor may for example include or be constituted by any current sensor and voltage sensor, respectively, known in the art. One or more of the voltage and/or current sensing units 21, 22 may be configured to measure both current and voltage.

One or more of the voltage and/or current sensing units 21, 22 may for example comprise a shunt resistor, which as such is known in the art.

As indicated in FIG. 1, the processing and protection modules 20 and 23 may receive or retrieve values of voltage and/or current sensed by the voltage and/or current sensing units 21 and 22, respectively. To that end, the processing and protection modules 20 and 23 may be communicatively coupled with the voltage and/or current sensing units 21 and 22, respectively, so as to facilitate or enable transmission of data, signals, commands, messages, etc., between the processing and protection modules 20 and 23 and the voltage and/or current sensing units 21 and 22, respectively. Data, signals, commands, messages, etc., may be transmitted between the processing and protection modules 20 and 23, which for example may be implemented by way of a communication unit 30. The communication unit 30 may hence act as a communication relay between the processing and protection modules 20 and 23. For implementing or providing communication links between the processing and protection modules 20 and 23 and the voltage and/or current sensing units 21 and 22, respectively, and/or between the processing and protection modules 20 and 23, in principle any appropriate communication technique or means known in the art may for example be employed. For example, any appropriate telecommunication, data transmission, digital transmission, or digital communication technique may be employed. Although wired connections between the entities 20, 21, 22, and are indicated in FIG. 1, it is to be understood that the communication technique or means may be wired and/or wireless as known in the art.

The apparatus 20, 23 is configured to determine that there is a fault (occurring) in the cable section 12 of the power transmission line 10, on a condition that:
- a magnitude of the at least one first travelling wave voltage or current time derivative, and/or a magnitude of the at least one second travelling wave voltage or current time derivative, exceeds a first threshold value K1 or a second threshold value K2, respectively, or,
- the magnitude of the at least one first travelling wave voltage or current time derivative and the magnitude of the at least one second travelling wave voltage or current time derivative exceed a third threshold value K3 and a fourth threshold value K4, possibly simultaneously or substantially simultaneously, respectively.

Each of the first threshold value K1 and the second threshold value K2 is based on the nominal power transmission line 10 voltage or current, and an estimated refraction factor of the power transmission line 10 indicating the extent of refraction of the at least one travelling wave at the junction 14 and/or junction 15 between the cable section 12 and the overhead line section 11 or between the cable section 12 and the overhead line section 13, respectively.

A fault in the cable section 12 will generate a travelling wave voltage equal to, or approximately equal to, the nominal power transmission line 10 voltage multiplied by the refraction factor. Relatively close to the junctions 14 and 15 between the cable section 12 and the overhead line sections 11 and 13, respectively, the travelling wave voltage or current will in general still not have experienced any significant attenuation, and the travelling wave will in general arrive at the ends S1, S2 of the power transmission line 10 in the overhead line sections 11 and 13, respectively, while still having a relatively large amplitude. Therefore, K1 and K2 may be selected based on the nominal power transmission line 10 voltage or current, and the estimated refraction factor.

Each of the third threshold value K3 and the fourth threshold value K4 is based on the nominal power transmission line voltage or current, the estimated refraction factor, and an estimated attenuation of the at least one travelling wave when travelling through the cable section 12 towards the one end S1 of the power transmission line 10 and towards the other end S2 of the power transmission line 10, respectively.

In case of a fault in the cable section 12 that is elsewhere in the cable, i.e. not 'relatively close' to the junctions 14 and 15 as discussed above, there will be a minimum travelling wave voltage or current time derivative at the one end at S1 and the other end at S2 of the power transmission line 10, based on attenuation of the at least one travelling wave when travelling through the cable section 12 towards the one end S1 of the power transmission line 10 and towards the other end S2 of the power transmission line 10, respectively. Thus, by comparing the travelling wave voltage or current time derivative at the one end S1 and the other end S2 of the power transmission line 10, respectively, with such a minimum travelling wave voltage or current time derivative at the one end S1 and the other end S2 of the power transmission line 10, it may be determined that the fault is not in any of the overhead line sections 11, 13, and that the fault therefore must be in the cable section 12. Therefore, K3 and K4 may be selected based on the nominal power transmission line 10 voltage or current, the estimated refraction factor, and an estimated attenuation of the at least one travelling wave when travelling through the cable section 12 towards the one end S1 of the power transmission line 10 and towards the other end S2 of the power transmission line 10, respectively.

In view of the above, the apparatus 20, 23 and the voltage and/or current sensing units 20, 21 may hence constitute or be included in a fault detection system for detecting a fault or faults in the power transmission line 10.

Figure 2:
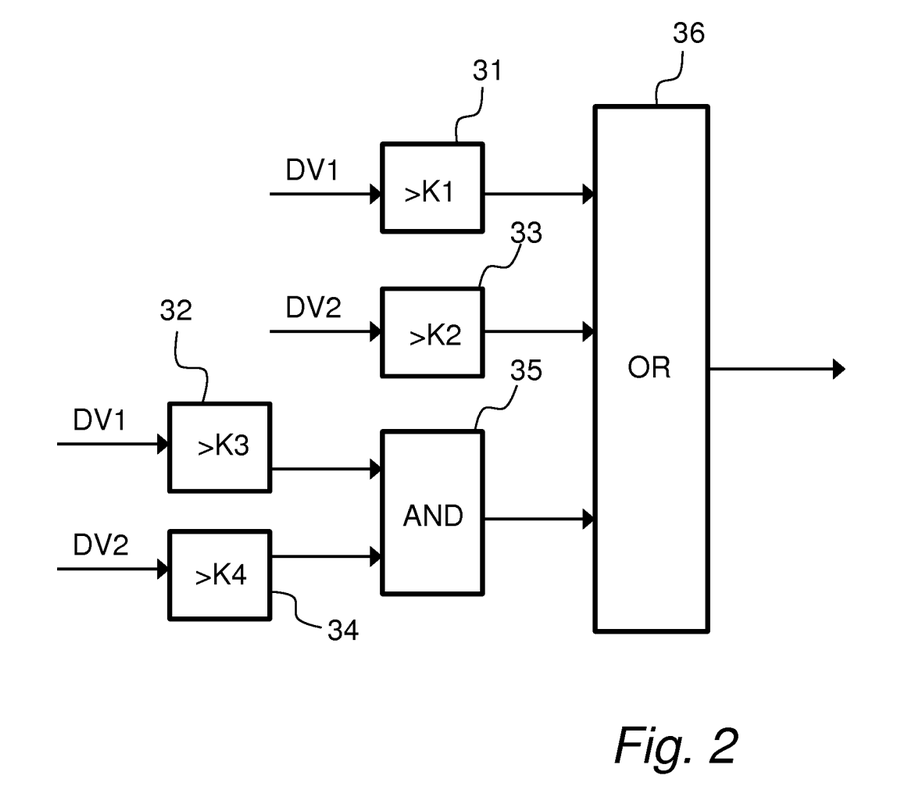
FIG. 2 is a logic diagram illustrating a method according to an embodiment of the present invention.

Referring now to FIG. 2, there is shown a logic diagram of a method according to an embodiment of the present invention. With reference to FIG. 1, the logic diagram in FIG. 2 illustrates steps that can be taken to determine that there is a fault (occurring) in the cable section 12 of the power transmission line 10, for example by way of steps that the processing and protection modules 20, 23 may be configured to take such as described above with reference to FIG. 1.

Input DV1 is corresponding to a value of a magnitude of the at least one first travelling wave voltage or current time derivative at the one end S1 of the power transmission line 10, for example as determined by processing and protection module 20, e.g. by way of measurements of voltage and/or current by voltage and/or current sensing unit 21.

Input DV2 is corresponding to a value of a magnitude of the at least one second travelling wave voltage or current time derivative at the other end S2 of the power transmission line 10, for example as determined by processing and protection module 23, e.g. by way of measurements of voltage and/or current by voltage and/or current sensing unit 22.

The logic diagram illustrated in FIG. 2 explains principles of embodiments of the present invention. As discussed in the following, the steps illustrated in the logic diagram could for example be carried out in or implemented at the processing and protection modules 20 and 23.

DV1 is input into decision blocks 31 and 32, which evaluate whether DV1 exceeds the first threshold value K1 and the third threshold value K3, respectively. The decision blocks 31 and 32 may for example be implemented in processing and protection module 20 (that is to say, the evaluations made in decision blocks 31 and 32 may be carried out by the processing and protection module 20).

DV2 is input into decision blocks 33 and 34, which evaluate whether DV2 exceeds the second threshold value K2 and the fourth threshold value K4, respectively. The decision blocks 33 and 34 may for example be implemented in processing and protection module 23 (that is to say, the evaluations made in decision blocks 33 and 33 may be carried out by the processing and protection module 23).

The outputs of decision blocks 33 and 34, which evaluate whether DV2 exceeds the second threshold value K2 and the fourth threshold value K4, respectively, may be transmitted from the processing and protection module 23 to the processing and protection module 20, e.g., by way of the communication unit 30.

Each of the decision blocks 31 and 32 outputs 1, TRUE, or the like (e.g., a 'true' condition) on a condition that DV1 exceeds the first threshold value K1 and DV1 exceeds the third threshold value K3, respectively, or 0, FALSE, or the like (e.g., a 'false' condition), otherwise. Each of the decision blocks 33 and 34 outputs 1, TRUE, or the like on a condition that DV2 exceeds the second threshold value K2 and DV2 exceeds the fourth threshold value K4, respectively, or 0, FALSE, or the like, otherwise. The outputs from the decision blocks 32 and 34 are inputs into decision block 35, which is an 'AND'-block, which outputs 1, TRUE, or the like on a condition that both of the inputs to the decision block 35 are 1, TRUE, or the like. The outputs from the decision blocks 31, 33 and 35 are inputs into decision block 36, which is an 'OR'-block, which outputs 1, TRUE, or the like on a condition that (at least) one of the inputs to the decision block 36 is 1, TRUE, or the like. An output equal to 1, TRUE, or the like from decision block 36 means that there is a fault in the cable section 12 of the power transmission line 10, and an output equal to 0, FALSE, or the like from decision block 36 means that there is not a fault in the cable section 12 of the power transmission line 10.

With further reference to FIG. 1, a fault which may occur in the power transmission line 10 generates at least one travelling wave in the power transmission line 10. In case a fault occurs in the cable section 12, the fault will (in principle) always be a permanent, solid ground fault. The fault in the cable section 12 induces a travelling wave voltage $V_{TW}$ which travels from the location of the fault in both directions along the power transmission line 10, in a forward direction $V_{TW,+}$, and in a backward direction $V_{TW,-}$. If the overhead line sections 11 and 13 each has an impedance $Z_{oh}$ and the cable section 12 has an impedance $Z_c$, the travelling wave voltages $V_{TW,+}$ and $V_{TW,-}$ will be refracted into the overhead line sections 11, 13 with a refraction factor $k=[(2Z_{oh})/(Z_{oh}+Z_c)]$. The refraction of the travelling wave voltage may result in amplification of the travelling wave voltage. A fault in the cable section 12 (or in one of the overhead line sections 11, 13) also induces a travelling wave current $I_{TW}$. The same principles apply for the travelling wave current $I_{TW}$ as for the travelling wave voltage $V_{TW}$. Embodiments of the present invention utilize such amplification of travelling wave voltages (and/or currents) which may occur at junctions between a cable section 12 and an adjacent overhead line section 11, 13 in order to identify or determine if a fault which may occur in the power transmission line 10 is in the cable section 12.

According to an embodiment of the present invention, the power transmission line 10 may be arranged in a bipolar configuration, e.g., where one pole operates at positive pole voltage and another pole operates at negative pole voltage. The at least one first travelling wave voltage or current time derivative at the one end at S1 of the power transmission line 10 may comprise at least one differential mode voltage or current time derivative at the one end, at S1, of the power transmission line 10. The at least one second travelling wave voltage or current time derivative at the other end, at S2, of the power transmission line may comprise at least one differential mode voltage or current time derivative at the other end of the power transmission line 10. Differential mode voltage or current time derivatives may for example be determined based on differential mode voltage or current, which may be defined as a difference between positive pole voltage or current and negative pole voltage or current, which difference may in one or more embodiments of the present invention be multiplied by a selected factor, for example approximately 0.7. Using differential mode voltage or current may reduce or avoid introduction into the voltage or current of any artifacts caused by the effect of the ground mode voltage.

According to another embodiment of the present invention, the power transmission line 10 may be arranged in a monopolar configuration. The at least one first travelling wave voltage or current time derivative at the one end S1 of the power transmission line 10 may comprise at least one line terminal side voltage or current time derivative at the one end S1 of the power transmission line 10. The at least one second travelling wave voltage or current time derivative at the other end at S2 of the power transmission line 10 may comprise at least one line terminal side voltage or current time derivative at the other end S2 of the power transmission line 10. For example, determination of the travelling wave voltage time derivatives at both ends S1, S2 of the power transmission line 10 may be based on the pole voltage in the ends S1, S2 of the power transmission line 10.

In accordance with the embodiment illustrated in FIG. 1, the power transmission line 10 may be selectively electrically connected or disconnected to a power system at the respective ones of both ends S1, S2 of the power transmission line 10 for example by way of circuit breakers CB1, CB2 arranged at respective ones of the one end S1 of the power transmission line 10 and the other end S2 of the power transmission line 10. The circuit breakers CB1, CB2 may for example be DC circuit breakers.

In accordance with the embodiment illustrated in FIG. 1, the power system 100 comprises two processing and protection modules 20, 23. In the event of a fault occurring in the power transmission line 10, the processing and protection modules 20, 23 (or some other entity) may transmit control signals to the circuit breakers CB1, CB2, respectively, in order to trip, or open them, so as to disconnect the power transmission line 10 from another portion or the rest of the power system 100. Subsequently, depending on the type of fault, the processing and protection modules 20, 23 (or some other entity) may transmit control signals to the circuit breakers CB1, CB2, respectively, to close them in order to restore power transmission via the power transmission line 10. This may be referred to as auto-reclosing. Auto-reclosing may for example be initiated on a condition that trip signal, or control signals for causing the circuit breakers CB1, CB2 to open, are transmitted to the circuit breakers CB1, CB2, for example by the respective ones of the processing and protection modules 20, 23.

In response to determining that there is a fault occurring in the cable section 12 of the power transmission line 10, at least one protective action for the power transmission line 10 may be performed. The at least one protective action, which hence may be performed in response to a determination that there is a fault in the cable section 12 of the power transmission line 10, may comprise disabling the corresponding auto-reclosing functions for the circuit breakers CB1, CB2. Since in principle all faults which may occur in cables are permanent faults and solid ground faults, if a fault can be ascertained to be located in the cable section 12 of the power transmission line 10, then the fault can be considered to be a permanent fault. In that case, the power transmission line 10 should not be re-energized, since this may create further disturbance in the rest of the power system 100 connected to the power transmission line 10. Re-energizing a mixed configuration power transmission line in case there is a cable fault in the power transmission line may cause damage in the cable section, and may also cause significant wear on any switching equipment such as circuit breakers and/or converter valves connected to the power transmission line.

As indicated in FIG. 1, the processing and protection module 20 may be communicatively connected or coupled to the circuit breaker CB1 in order to control operation thereof, and the processing and protection module 23 may be communicatively connected to the circuit breaker CB2 in order to control operation thereof. In the context of the present application, by two or more entities being communicatively connected or coupled it is meant that the two or more entities are coupled so as to facilitate or enable transmission of data, signals, commands, messages, etc., between the two or more entities. For implementing or providing such a communicative coupling, in principle any appropriate communication technique or means known in the art may for example be employed. For example, any appropriate telecommunication, data transmission, digital transmission, or digital communication technique may be employed. Although wired connections for example between the communication unit 30 and the respective ones of the processing and protection modules 20 and 23, and between the processing and protection modules 20 and 23 and the circuit breakers CB1, CB2, respectively, are indicated in FIG. 1, it is to be understood that the communication technique or means for achieving communicative coupling or connection between two entities may in accordance with one or more embodiments of the present invention be wired and/or wireless as known in the art.

Table 1 shows the result of a simulation of the power transmission line 10 using PSCAD® for different cases where a fault in the cable section 12 has been introduced at different locations x along the length of the cable section 12. In the simulation it has been assumed, by way of example, that the length of the overhead line section 11 is 150 km, that the length of the cable section 12 is 300 km, and that the length of the overhead line section 13 is 100 km. As shown in FIG. 1, the coordinate x (in km) is defined from the junction 14 between the overhead line section 11 and the cable section 12 along the length of the cable section 12 to the junction 15 between the cable section 12 and the overhead line section 13. That is to say, the junction 14 between the overhead line section 11 and the cable section 12 is at x=0 km, at one end of the cable section 12, and the junction 15 between the cable section 12 and the overhead line section 13 is at x=300 km, equal to the length of the cable section 12 and at the other end of the cable section 12. In the simulations it has further been assumed, also by way of example, that each of the overhead line sections 11 and 13 has a surge impedance $Z_{oh}$=350Ω and that the cable section 12 has a surge impedance $Z_c$=20Ω. The travelling wave voltage derivatives at S1 and S2 have been determined under these assumptions and at different locations x of a fault along the length of the cable section 12. The results are shown in Table 1 below.

TABLE 1

| Travelling wave voltage time derivative | Fault location x (km) along the cable section 12 | | | | | | | | |
|---|---|---|---|---|---|---|---|---|---|
| | 3 | 30 | 50 | 100 | 150 | 200 | 250 | 270 | 297 |
| at S1 (kV/100 μs) | −641 | −482 | −363 | −190 | −100 | −51 | −25 | −20 | −13.7 |
| at S2 (kV/100 μs) | −14.4 | −20 | −27 | −52 | −100 | −189 | −363 | −483 | −686 |

Table 2 below shows the minimum travelling wave voltage time derivatives at the ends S1 and S2 of the power transmission line 10 for the case where there is a fault in the power transmission line 10 which is not in the cable section 12 (i.e., the fault is in one of the overhead line sections 11 or 13) of the power transmission line 10, as determined by way of the simulations.

TABLE 2

| Minimum travelling wave voltage time derivative | Overhead line section faults before junction 14 (i.e. in overhead line section 11) | Overhead line section faults after junction 15 (i.e. in overhead line section 13) |
|---|---|---|
| at S1 (kV/100 μs) | −410 | −13.4 |
| at S2 (kV/100 μs) | −12.37 | −410 |

Based on Table 1, the first and second threshold values K1 and K2 could for the power transmission line 10 configuration illustrated in FIG. 1 for example be selected according to K1=K2=450 kV/100 μs or thereabout. And further, based on Table 2, the third to fourth threshold values K3 and K4 could for the power transmission line 10 configuration illustrated in FIG. 1 for example be selected according to K3=K4=20 kV/100 μs or thereabout.

As mentioned in the foregoing, based on the threshold values K1, K2, K3 and K4 there may be determined (e.g., by the processing and protection modules 20 and 23) that there is a fault in the cable section 12 of the power transmission line 10. A fault is determined to be in the cable section 12 of the power transmission line 10 on a condition that a magnitude of the at least one first travelling wave voltage or current time derivative in one end of the power transmission line 10 at S1, and/or a magnitude of the at least one second travelling wave voltage or current time derivative in the other end of the power transmission line 10 at S2, exceeds a first threshold value K1 or a second threshold value K2, respectively, or that the magnitude of the at least one first travelling wave voltage or current time derivative and the magnitude of the at least one second travelling wave voltage or current time derivative exceed a third threshold value K3 and a fourth threshold value K4, respectively.

As indicated above, once a fault in the cable section 12 has been identified or determined, auto-reclosing may be disabled for both of the circuit breakers CB1, CB2. The disabling of the auto-reclosing may be effected by way of the processing and protection modules 20 and 23 controlling operation of the circuit breakers CB1 and CB2, respectively.

For example, for a fault in cable section 12 that occurs relatively close to the junction point 14, the fault can be identified by the processing and protection module 20 at the end of the power transmission line 10 at the station S1 based on the first threshold value K1, and auto-reclosing for the circuit breaker CB1 may then be disabled, and information regarding the identified cable fault may possibly be transmitted to the processing and protection module 23 at the end of the power transmission line 10 at the station S2, for example via the communication unit 30, which subsequently may disable auto-reclosing for the circuit breaker CB2.

Similarly, for a fault in cable section 12 that occurs relatively close to the junction point 15, the fault can be identified by the processing and protection module 23 at the end of the power transmission line 10 at the station S2 based on the second threshold value K2, and auto-reclosing for the circuit breaker CB2 may then be disabled, and information regarding the identified cable fault may possibly be transmitted to the processing and protection module 23 at the end of the power transmission line 10 at the station S1, for example via the communication unit 30, which subsequently may disable auto-reclosing for the circuit breaker CB1.

In case the fault occurs anywhere else in the cable section 12, which is not 'close' to the junction 14 or 15, the fault can be identified by or at both of the ends or stations S1 and S2 based on the third and fourth threshold values K3 and K4.

As indicated in the foregoing, information regarding the identified cable fault for example as determined by the processing and protection module 20 at the end of the power transmission line 10 at the station S1 (e.g., output of block 32 or block 31) may possibly be transmitted to the processing and protection module 23 at the end of the power transmission line 10 at the station S2, and information regarding the identified cable fault for example as determined by the processing and protection module 23 (e.g., output of block 34 or block 33) at the end of the power transmission line 10 at the station S2 may possibly be transmitted to the processing and protection module 20 at the end of the power transmission line 10 at the station S1. The transmission of information can for example be implemented or realized by way of the communication unit 30. Subsequently, based on the information, a decision may be obtained via the output of block 35 and block 36 both in processing and protection module 20 and in processing and protection module 23 related to the final auto-reclosing actions for both of the circuit breakers CB1 and CB2, which auto-reclosing actions may be disabled in case a cable fault has been detected.

It is to be understood that for different types of faults, the values of K1, K2, K3 and K4 may vary. For example, K1, K2, K3, and/or K4 may vary depending on whether the fault is a pole to ground fault, a pole to pole fault, or another type of fault, since the fault currents and voltages between these and other types of faults may be different.

It is to be understood that even though principles of embodiments of the present invention have been described above with reference to FIGS. 1 and 2 in the context of an example of a mixed power transmission line which comprises three sections including one cable section and two overhead line sections between which the cable section is arranged, the same or similar principles are contemplated to apply to other mixed configuration power transmission lines, which for example may include more than one cable section and more than two overhead line sections, which may be arranged in different ways, and possibly with different lengths.

The apparatus 20, 23 or any one of the processing and protection modules 20, 23, may include or be constituted for example by any suitable CPU, microcontroller, DSP, ASIC, FPGA, etc., or any combination thereof. The apparatus 20, 23 or any one of the processing and protection modules 20, 23 may optionally be capable of executing software instructions stored in a computer program product e.g. in the form of a memory. The memory may for example be any combination of RAM and ROM. The memory may comprise persistent storage, which for example can be a magnetic memory, an optical memory, a solid state memory or a remotely mounted memory, or any combination thereof.

Figure 3:
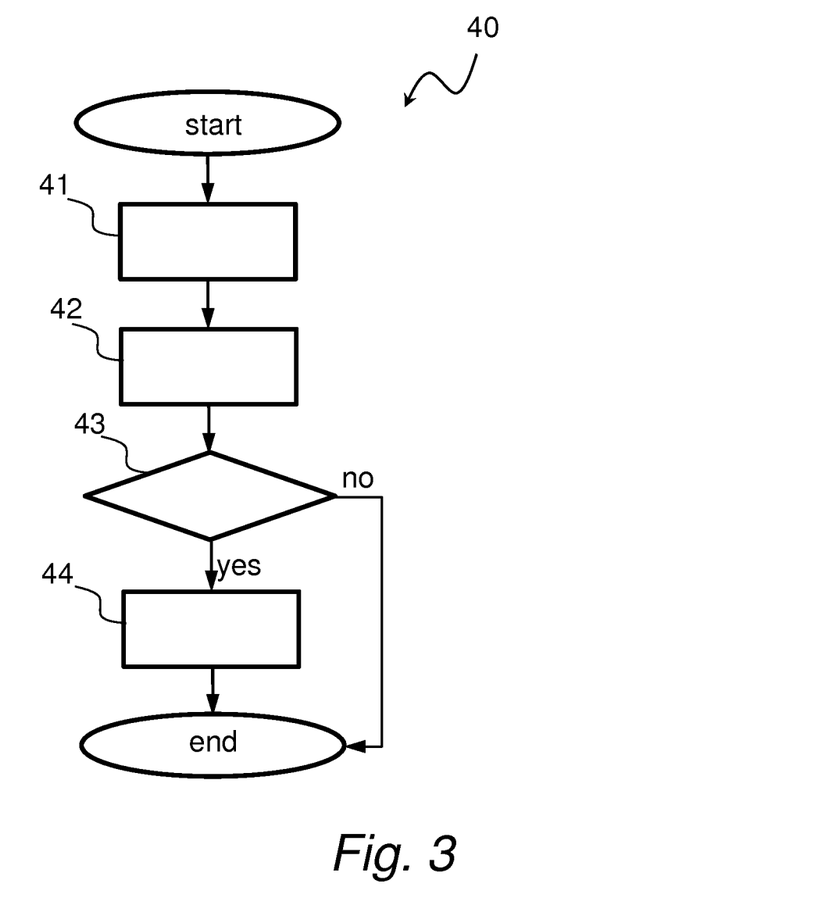
FIG. 3 is a schematic flowchart of a method according to an embodiment of the present invention.

FIG. 3 is a schematic flowchart of a method 40 according to an embodiment of the present invention. The method 40 is a method of fault detection in a power transmission line which comprises a plurality of sections arranged between one end of the transmission line and the other end of the transmission line, wherein the plurality of sections of the power transmission line comprises at least one overhead line section and at least one cable section. On a condition that a fault occurs in the power transmission line, at least one travelling wave is generated in the power transmission line. The method 40 comprises determining at least one first travelling wave voltage or current time derivative at the one end of the power transmission line, 41. At least one second travelling wave voltage or current time derivative at the other end of the power transmission line is determined, 42.

At 43, it is checked if a magnitude of the at least one first travelling wave voltage or current time derivative and/or a magnitude of the at least one second travelling wave voltage or current time derivative exceeds a first threshold value or a second threshold value, respectively, or if the magnitude of the at least one first travelling wave voltage or current time derivative and the magnitude of the at least one second travelling wave voltage or current time derivative exceed a third threshold value and a fourth threshold value, respectively.

If that is the case, it is determined that there is a fault occurring in at least one cable section of the power transmission line, 44, and the method 40 may then end. Otherwise, the method 40 may end without a determination that there is a fault occurring in at least one cable section of the power transmission line.

Each of the first threshold value and the second threshold value is based on the nominal transmission line voltage or current and an estimated refraction factor of the transmission line indicating the extent of refraction of the at least one travelling wave at a junction between the at least one cable section and an overhead line section adjacent to the at least one cable section. Each of the third threshold value and the fourth threshold value is based on the nominal transmission line voltage or current, the estimated refraction factor, and an estimated attenuation of the at least one travelling wave when travelling through the at least one cable section towards the one end of the power transmission line and towards the other end of the power transmission line, respectively.

Figure 4:
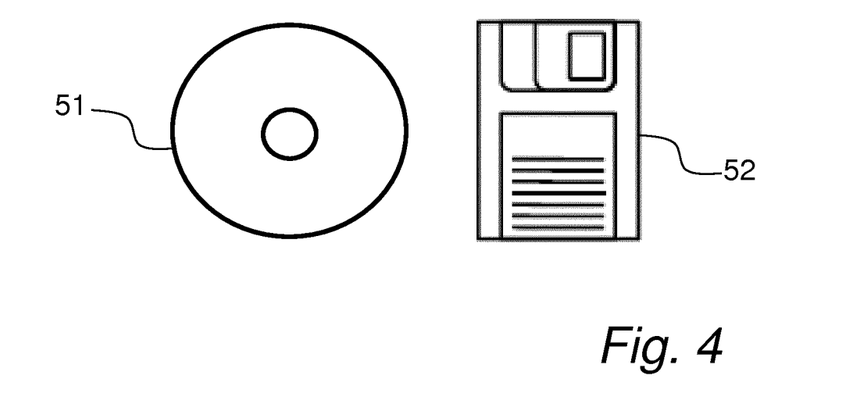
FIG. 4 is a schematic view of computer-readable means carrying computer program code according to embodiments of the present invention.

Referring now to FIG. 4, there is shown a schematic view of computer-readable means 51, 52 carrying computer program code according to embodiments of the present invention. The computer-readable means 51, 52 or computer program code is adapted to execute or run in (a processing module of) an apparatus according to an embodiment of the present invention, e.g. an apparatus 20, 23 including processing and protection modules 20 and 23 as described above with reference to FIG. 1. The computer-readable means 51, 52 or computer program code is configured to, when executed in the apparatus, perform a method according to an embodiment of the present invention, e.g. as described above with reference to FIG. 2 or 3. The computer-readable means 51, 52, or computer readable storage mediums, shown in FIG. 4 include a Digital Versatile Disc (DVD) 51 and a floppy disk 52. Although only two different types of computer-readable means 51, 52 are depicted in FIG. 4, the present invention encompasses embodiments employing any other suitable type of computer-readable means or computer-readable digital storage medium, such as, but not limited to, a nonvolatile memory, a hard disk drive, a CD, a Flash memory, magnetic tape, a USB memory device, a Zip drive, etc.

In conclusion, a method and an apparatus for fault detection in a mixed power transmission line comprising a plurality of sections arranged between one end of the transmission line and the other end of the transmission line and comprising at least one overhead line section and at least one cable section are disclosed. Based on a comparison travelling wave voltage or current time derivatives at one or both of the ends of the power transmission line with selected threshold values, it is determined if there is a fault occurring in at least one cable section of the power transmission line. Embodiments of the present invention utilize amplification of travelling wave voltages and/or currents which may occur at junctions between a cable section and an adjacent overhead line section in determining if the fault occurs in a cable section of the power transmission line.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method of fault detection in a power transmission line comprising a plurality of sections arranged between a one end of the transmission line and the other end of the transmission line, wherein the plurality of sections of the power transmission line comprises at least two overhead line sections and at least one cable section arranged between the at least two overhead line sections, wherein on a condition that a fault occurs in the power transmission line at least one travelling wave is generated in the power transmission line, the method comprising:
    determining at least one first travelling wave voltage or current time derivative at the one end of the power transmission line, the one end of the power transmission line being included in a first overhead line section;
    determining at least one second travelling wave voltage or current time derivative at the other end of the power transmission line, the other end of the power transmission line being included in a second overhead line section;
    evaluating whether the first travelling wave voltage or current time derivative exceeds a first threshold value;
    evaluating whether the second travelling wave voltage or current time derivative exceeds a second threshold value;
    evaluating whether the first travelling wave voltage or current time derivative exceeds a third threshold value;
    evaluating whether the second travelling wave voltage or current time derivative exceeds a fourth threshold value; and
    on a condition that a magnitude of the at least one first travelling wave voltage or current time derivative and/or a magnitude of the at least one second travelling wave voltage or current time derivative exceeds said first threshold value or said second threshold value, respectively, determining that there is a fault occurring in at least one cable section of the power transmission line,
    wherein each of the first threshold value and the second threshold value is based on the nominal transmission line voltage or current and an estimated refraction factor of the transmission line indicating the extent of refraction of the at least one travelling wave at a junction between the at least one cable section and an overhead line section adjacent to the at least one cable section; or
    on a condition that that the magnitude of the at least one first travelling wave voltage or current time derivative and the magnitude of the at least one second travelling wave voltage or current time derivative exceed said third threshold value and said fourth threshold value, respectively, determining that there is a fault occurring in the at least one cable section of the power transmission line,
    wherein each of the third threshold value and the fourth threshold value is based on the nominal transmission line voltage or current, the estimated refraction factor, and an estimated attenuation of the at least one travelling wave when travelling through the at least one cable section towards the one end of the power transmission line and towards the other end of the power transmission line, respectively.

2. The method according to claim 1, wherein each of the plurality of sections of the power transmission line comprises an overhead line section or a cable section.

3. The method according to claim 1, further comprising performing, in response to determining that there is a fault occurring in the at least one cable section of the power transmission line, at least one protective action for the power transmission line.

4. The method according to claim 3, wherein the power transmission line is selectively electrically connectable and disconnectable to a power system at the one end of the power transmission line and at the other end of the power transmission line, respectively, by way of at least one circuit breaker arranged at the one end of the power transmission line and at the other end of the power transmission line, respectively, said circuit breakers being configured to be opened in the event of a fault occurring in the power transmission line and wherein the at least one protective action comprises disabling auto-reclosing for the at least one circuit breaker at the one end of the power transmission line and at the other end of the power transmission line, respectively.

5. The method according to claim 1, wherein the power transmission line comprises a High Voltage Direct Current transmission line.

6. The method according to claim 5, wherein the power transmission line is arranged in a bipolar configuration, and wherein the at least one first travelling wave voltage or current time derivative at the one end of the power transmission line comprises at least one differential mode voltage or current time derivative at the one end of the power transmission line, and the at least one second travelling wave voltage or current time derivative at the other end of the power transmission line comprises at least one differential mode voltage or current time derivative at the other end of the power transmission line.

7. The method according to claim 5, wherein the power transmission line is arranged in a monopolar configuration, and wherein the at least one first travelling wave voltage or current time derivative at the one end of the power transmission line comprises at least one line terminal side voltage or current time derivative at the one end of the power transmission line, and the at least one second travelling wave voltage or current time derivative at the other end of the power transmission line comprises at least one line terminal side voltage or current time derivative at the other end of the power transmission line.

8. The method according to claim 1, wherein determining at least one first travelling wave voltage or current time derivative at the one end of the power transmission line comprises sensing at the one end of the power transmission line a plurality of travelling wave voltages or currents at different points in time, and
wherein determining at least one second travelling wave voltage or current time derivative at the other end of the power transmission line comprises sensing at the other end of the power transmission line a plurality of travelling wave voltages or currents at different points in time.

9. The method according to claim 8, wherein the sensing at the one end of the power transmission line of the plurality of travelling wave voltages or currents and the sensing at the other end of the power transmission line of the plurality of travelling wave voltages or current are carried out during substantially the same period of time.

10. An apparatus for detecting a fault in a power transmission line comprising a plurality of sections arranged between one end of the transmission line and the other end of the transmission line, wherein the plurality of sections of the power transmission line comprises at least two overhead line sections and at least one cable section arranged between the at least two overhead line sections, wherein on a condition that a fault occurs in the power transmission line at least one travelling wave is generated in the power transmission line, the apparatus being configured to:
determine at least one first travelling wave voltage or current time derivative based on a plurality of travelling wave voltages or currents sensed at different points in time at the one end of the power transmission line, the one end of the power transmission line being included in a first overhead line section;
determine at least one second travelling wave voltage or current time derivative based on a plurality of sensed travelling wave voltages or currents sensed at different points in time at the other end of the power transmission line, the other end of the power transmission line being included in a second overhead line section;
evaluate whether the first travelling wave voltage or current time derivative exceeds a first threshold value;
evaluate whether the second travelling wave voltage or current time derivative exceeds a second threshold value;
evaluate whether the first travelling wave voltage or current time derivative exceeds a third threshold value;
evaluate whether the second travelling wave voltage or current time derivative exceeds a fourth threshold value; and
on a condition that a magnitude of the at least one first travelling wave voltage or current time derivative and/or a magnitude of the at least one second travelling wave voltage or current time derivative exceeds said first threshold value or said second threshold value, respectively, determine that there is a fault occurring in at least one cable section of the power transmission line,
wherein each of the first threshold value and the second threshold value is based on the nominal transmission line voltage or current and an estimated refraction factor of the transmission line indicating the extent of refraction of the at least one travelling wave at a junction between the at least one cable section and an overhead line section adjacent to the at least one cable section; or
on a condition that that the magnitude of the at least one first travelling wave voltage or current time derivative and the magnitude of the at least one second travelling wave voltage or current time derivative exceed said third threshold value and said fourth threshold value, respectively, determine that there is a fault occurring in the at least one cable section of the power transmission line,
wherein each of the third threshold value and the fourth threshold value is based on the nominal transmission line voltage or current, the estimated refraction factor, and an estimated attenuation of the at least one travelling wave when travelling through the at least one cable section towards the one end of the power transmission line and towards the other end of the power transmission line, respectively.

11. A fault detection system for detecting a fault in a power transmission line comprising a plurality of sections arranged between one end of the transmission line and the other end of the transmission line, wherein at least two overhead line sections and at least one cable section arranged between the at least two overhead line sections, wherein on a condition that a fault occurs in the power transmission line at least one travelling wave is generated in the power transmission line, the fault detection system comprising:
at least one voltage and/or current sensing unit configured to:
sense a plurality of travelling wave voltages or currents sensed at different points in time at the one end of the power transmission line, the one end of the power transmission line being included in a first overhead line section; and
sense a plurality of travelling wave voltages or currents sensed at different points in time at the other end of the power transmission line, the other end of the power transmission line being included in a second overhead line section; and
the apparatus according to claim 10.

12. A power system comprising:
at least one transmission line interconnecting at least two different portions of the power system; and the fault detection system according to claim 11 for detecting a fault in the power transmission line.

13. A non-transitory computer-readable storage medium on which there is stored a computer program product configured to, when executed in the apparatus according to claim 10, perform a method of fault detection in a power transmission line comprising a plurality of sections arranged between a one end of the transmission line and the other end of the transmission line, wherein the plurality of sections of the power transmission line comprises at least two overhead line sections and at least one cable section arranged between the at least two overhead line sections, wherein on a condition that a fault occurs in the power transmission line at least one travelling wave is generated in the power transmission line, the method comprising:
  determining at least one first travelling wave voltage or current time derivative at the one end of the power transmission line, the one end of the power transmission line being included in a first overhead line section;
  determining at least one second travelling wave voltage or current time derivative at the other end of the power transmission line, the other end of the power transmission line being included in a second overhead line section;
  evaluating whether the first travelling wave voltage or current time derivative exceeds a first threshold value;
  evaluating whether the second travelling wave voltage or current time derivative exceeds a second threshold value;
  evaluating whether the first travelling wave voltage or current time derivative exceeds a third threshold value;
  evaluating whether the second travelling wave voltage or current time derivative exceeds a fourth threshold value; and
  on a condition that a magnitude of the at least one first travelling wave voltage or current time derivative and/or a magnitude of the at least one second travelling wave voltage or current time derivative exceeds said first threshold value or said second threshold value, respectively, determining that there is a fault occurring in at least one cable section of the power transmission line,
  wherein each of the first threshold value and the second threshold value is based on the nominal transmission line voltage or current and an estimated refraction factor of the transmission line indicating the extent of refraction of the at least one travelling wave at a junction between the at least one cable section and an overhead line section adjacent to the at least one cable section; or
  on a condition that that the magnitude of the at least one first travelling wave voltage or current time derivative and the magnitude of the at least one second travelling wave voltage or current time derivative exceed said third threshold value and said fourth threshold value, respectively, determining that there is a fault occurring in the at least one cable section of the power transmission line,
  wherein each of the third threshold value and the fourth threshold value is based on the nominal transmission line voltage or current, the estimated refraction factor, and an estimated attenuation of the at least one travelling wave when travelling through the at least one cable section towards the one end of the power transmission line and towards the other end of the power transmission line, respectively.

14. The method according to claim 2, further comprising performing, in response to determining that there is a fault occurring in the at least one cable section of the power transmission line, at least one protective action for the power transmission line.

15. The method according to claim 2, wherein the power transmission line comprises a High Voltage Direct Current transmission line.

16. The method according to claim 3, wherein the power transmission line comprises a High Voltage Direct Current transmission line.

17. The method according to claim 4, wherein the power transmission line comprises a High Voltage Direct Current transmission line.

18. The method according to claim 2, wherein determining at least one first travelling wave voltage or current time derivative at the one end of the power transmission line comprises sensing at the one end of the power transmission line a plurality of travelling wave voltages or currents at different points in time, and
  wherein determining at least one second travelling wave voltage or current time derivative at the other end of the power transmission line comprises sensing at the other end of the power transmission line a plurality of travelling wave voltages or currents at different points in time.

19. The method according to claim 3, wherein determining at least one first travelling wave voltage or current time derivative at the one end of the power transmission line comprises sensing at the one end of the power transmission line a plurality of travelling wave voltages or currents at different points in time, and
  wherein determining at least one second travelling wave voltage or current time derivative at the other end of the power transmission line comprises sensing at the other end of the power transmission line a plurality of travelling wave voltages or currents at different points in time.

20. The method according to claim 4, wherein determining at least one first travelling wave voltage or current time derivative at the one end of the power transmission line comprises sensing at the one end of the power transmission line a plurality of travelling wave voltages or currents at different points in time, and
  wherein determining at least one second travelling wave voltage or current time derivative at the other end of the power transmission line comprises sensing at the other end of the power transmission line a plurality of travelling wave voltages or currents at different points in time.

* * * * *